United States Patent
Ryoo

(10) Patent No.: US 6,255,153 B1
(45) Date of Patent: Jul. 3, 2001

(54) METHOD OF MANUFACTURING A SEMICONDUCTOR DEVICE

(75) Inventor: Chang Woo Ryoo, Kyungki-Do (KR)

(73) Assignee: Hyundai Electronics Industries Co., Ltd., Kyungki-Do (KR)

(*) Notice: Subject to any disclaimer, the term of this patent is extended or adjusted under 35 U.S.C. 154(b) by 0 days.

(21) Appl. No.: 09/221,286

(22) Filed: Dec. 23, 1998

(30) Foreign Application Priority Data

Dec. 30, 1997 (KR) .................................................. 97 79268

(51) Int. Cl.$^7$ .............................................. H01L 21/8238
(52) U.S. Cl. .......................... 438/217; 257/402; 257/404
(58) Field of Search .......................... 438/217; 257/324, 257/391, 402, 404

(56) References Cited

U.S. PATENT DOCUMENTS

| | | | |
|---|---|---|---|
| 4,151,008 | * 4/1979 | Kirkpartick | 219/121 |
| 4,885,257 | 12/1989 | Matsushita | 437/11 |
| 4,962,051 | 10/1990 | Liaw | 437/26 |
| 5,691,550 | * 11/1997 | Kohyama | 257/301 |
| 5,698,884 | * 12/1997 | Dennen | 257/345 |
| 5,773,356 | 6/1998 | Gonzalez et al. | 438/473 |
| 5,939,757 | * 8/1999 | Kim | 257/371 |
| 5,966,599 | * 10/1999 | Walker et al. | 438/217 |
| 5,989,949 | * 11/1999 | Kim et al. | 438/217 |
| 6,037,203 | * 3/2000 | Kim | 438/217 |
| 6,066,523 | * 5/2000 | Shim et al. | 438/228 |

FOREIGN PATENT DOCUMENTS

| | | | |
|---|---|---|---|
| 2 320 802 | * 1/1998 | (GB) | H01L/21/71 |
| 57-43417 | 3/1982 | (JP) | |
| 58-137244 | 8/1983 | (JP) | |
| 60-31231 | 2/1985 | (JP) | |
| 60-31232 | 2/1985 | (JP) | |
| 61-42911 | 3/1986 | (JP) | |
| 61-156820 | 4/1986 | (JP) | |
| 1-315 142 | 12/1989 | (JP) | |
| 2-237032 | 9/1990 | (JP) | |
| 4-130731 | 5/1992 | (JP) | |
| 4-363025 | 12/1992 | (JP) | |

* cited by examiner

Primary Examiner—Charles Bowers
Assistant Examiner—David S Blum
(74) Attorney, Agent, or Firm—Cohen, Pontani, Lieberman & Pavane

(57) ABSTRACT

The present invention is directed to a method of manufacturing a semiconductor device having a triple-well structure, comprising the steps of: forming a first pattern of a semiconductor substrate having a first N-well forming area, a R-well forming area, a second N-well forming area and a P-well forming area; forming a first layer within the substrate at a predetermining depth by implanting a N-type impurity ion using the first pattern as a mask; forming a bottom N-well within the substrate at a predetermined depth by implanting a N-type impurity ion using the first pattern as a mask; removing the first pattern; forming a second pattern on the substrate; forming a first lateral N-well and a second lateral N-well by implanting a N-type impurity ion using the second pattern as a mask, and portions of the first and second lateral N-wells overlap with opposite edge portions of the bottom N-well, thereby forming a N-well; removing the second pattern; forming a third pattern on the substrate; forming a second defect layer within the substrate at a predetermined depth by implanting a P-type impurity ion using the third pattern as a mask; forming a fourth pattern on the substrate; forming a R-well by implanting a P-type impurity ion using the fourth pattern as a mask; removing the fourth pattern; and performing rapid head treatment.

4 Claims, 3 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device, and more particularly to a method of manufacturing a semiconductor device with a triple-well structure.

2. Description of the Prior Art

Typically, more serious influence by defect and impurities is given as integration of a semiconductor device increases. Lattice defects and impurities which exist in the active area of a semiconductor device reduce life time of the minority carrier and increase leakage current rapidly. Also, such lattice defects and impurities deteriorate film quality of the oxide film and make the threshold voltage of a CMOS device disuniform. Thus, technology to remove lattice defects and impurities is needed. The following two(2) methods are used at present.

The first method is to use the heat process of three(3) steps to execute heat treatment respectively at high, low and high temperature. The second method is to form a lattice defect layer on a semiconductor substrate by heat treatment or ion implantation using high energy after damaging the backside of the semiconductor substrate. One of the disadvantages of the second method is to need long-time process at high temperature, and its process is complex. Particularly, it is a problem in that the second method removes dislocation to act as a trap site of impurities because of process heat, and impurities return to the active area of the semiconductor substrate again.

On the other hand, the conventional method to remove defects and impurities by ion implantation using million electron volts(MeV) is known as the technology to remove defects in a device by inducing defect-to-defect interaction after forming defects deeply in the semiconductor substrate by ion implantation of dopants such as silicon(Si) and carbon(C) that have a little influence on electric property of a parent material.

SUMMARY OF THE INVENTION

Accordingly, it is an object of the present invention to provide a method of manufacturing a semiconductor device which solves the above problems by forming a defect layer of high density on the lower part of a semiconductor substrate before forming a well on the semiconductor substrate, and by performing rapid heat treatment so that the defects and impurities which exist within the semiconductor substrate may be captured by the defect layer or diffuse the outside.

To achieve the above object, the invention provides a method of manufacturing a semiconductor device having a triple-well structure, comprising the steps of:

Forming a first pattern on a semiconductor substrate having a first N-well forming area, a R-well forming area, a second N-well forming area and a P-well forming area, and the first pattern is formed so that the first N-well forming area, the R-well forming area and the second N-well forming area are exposed;

Forming a first defect layer within the substrate at a first predetermined depth from a surface of the substrate by implanting a first N-type impurity ion using the first pattern as a mask;

Forming a bottom N-well within the substrate at a second depth by implanting a second N-type impurity ion using the first pattern as a mask, and the bottom N-well is formed a distance from said substrate surface over the first defect layer with the bottom N-well separated at a distance from the first defect layer;

Removing the first pattern;

Forming a second pattern on the substrate, and the second pattern is formed so that the first N-well forming area, and the second N-well forming area between the R-well forming area and the P-well forming area, are exposed;

Forming a first lateral N-well and a second lateral N-well by implanting a third N-type impurity ion using the second pattern as a mask with portions of the first and second lateral N-wells overlapping opposite end edge portions of the bottom N-well, thereby forming a N-well;

Removing the second pattern;

Forming a third pattern on the substrate, and the third pattern is formed so that the P-well forming area is exposed;

Forming a second defect layer within the substrate at a third predetermined depth by implanting a first P-type impurity ion using the third patter as a mask;

Forming a P-well by implanting a second P-type impurity ion using the third pattern as a mask, and the P-well is formed over the second defect layer and the bottom N-well is separated at a distance from the second defect layer;

Removing the third pattern;

Forming a fourth pattern on the substrate, and the fourth pattern is formed so that the R-well forming area is exposed;

Forming a R-well by implanting a third P-type impurity ion using the fourth pattern as a mask, and the R-well is formed in a portion of the substrate which is enclosed by the N-well;

Removing the fourth pattern; and

Performing rapid heat treatment.

It is to be understood that both the foregoing general description and the following detailed description are exemplary and explanatory and are intended to provide further explanation of the invention as claimed.

BRIEF DESCRIPTION OF THE DRAWINGS

The above object, and other features and advantages of the present invention will become more apparent by describing the preferred embodiment thereof with reference to the accompanying drawings, in which.

Similar reference characters refer to similar parts in the several views of the drawings.

DETAILED DESCRIPTION OF THE PREFERRED EMBODIMENTS

Reference will now be made in detail to the preferred embodiments of the present invention, and examples of which are illustrated in the accompanying drawings.

FIG. 1 to FIG. 5 are sectional-views for explaining a manufacturing method of a semiconductor device in accordance with the present invention.

Figure 1:
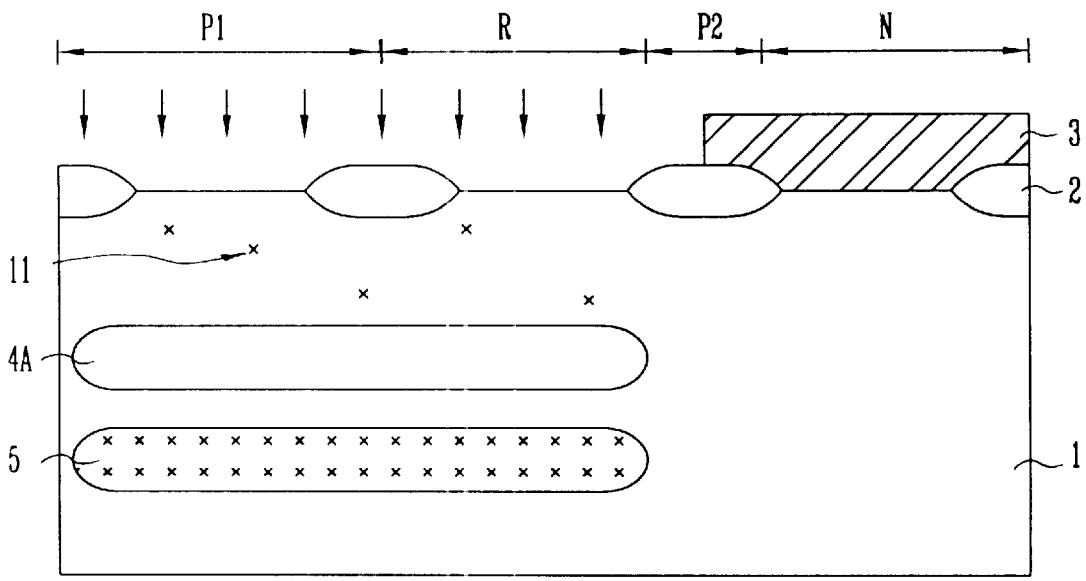
FIG. 1 to FIG. 5 are sectional views for explaining a manufacturing method of a semi conductor device in accordance with the present invention.

Referring to FIG. 1, a first pattern 3, which is a photoresist film, is formed on a semiconductor substrate 1 which is divided into a first N-well forming area P1, a R-well forming area R, a second N-well forming area P2 and a P-well forming area N by a plurality of field oxide films 2. The first pattern 3 is formed so that the first N-well forming area P1, the R-well forming area R and the second N-well forming area P2 are exposed. A first defect layer 5 is formed by implanting N-type high concentration impurity ion such as phosphorus, with energy of 2.0 to 3.0 MeV and dose of 1.0 E 14 to 3.0 E 15, ions/cm² into the semiconductor substrate 1 using the first pattern 3 as a mask. The first defect layer 5 is formed in the semiconductor substrate 1 at a first predetermined depth.

The first defect layer 5 is formed at the depth more than 1.5 μm from the surface of the substrate 1 so that the highest ion concentration is obtained at the depth of 1.5 to 2.8 μm from the surface of the substrate 1. A bottom N-well 4A is formed over the first defect layer 5 by continuously implanting N-type high concentration ions such as phosphorus, with energy of 1.5 to 1.7 MeV and dose of 1.0 E 13 to 3.0 E 13 ions/cm² using the first pattern 3 as a mask. The bottom N-well 4A is formed in the semiconductor substrate 1 at a second predetermined depth from the substrate surface, and the bottom N-well 4A also is separated at a predetermined distance from the first defect layer 5. The implanted ions come into collision, elastically and non-elastically, with atoms in the parent material, causing occurrence of many. Therefore, defect 11 due to unbalance concentration, which exist excessively in the substrate, occur within the substrate 1. Such a defect 11 has very unstable state chemically and try to be stabilized by interacting with other surrounding defects 11.

Figure 2:
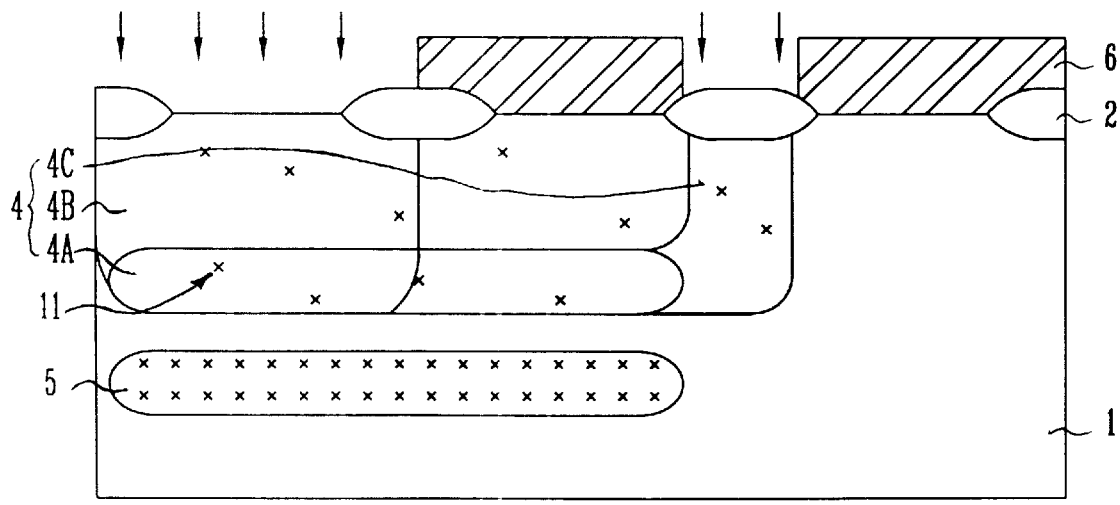

Referring the FIG. 2, the first pattern 3 is removed and a second pattern 6, which is a photoresist film, is formed on the semiconductor substrate 1. The second pattern 6 is formed so that not only the first N-well forming area P1 but the second N-well forming area P2 between the R-well forming area R and the P-well forming area N, are exposed. A first lateral N-well 4B and a second lateral N-well 4C are formed by implanting N-type impurity ion such as phosphorus into the semiconductor substrate 1 and then an ion implantation process for adjusting threshold voltage is performed using the second pattern 6 as a mask. Portions of the first and second lateral N-wells 4B and 4C overlap with both edge portions of the bottom N-well 4A. An N-well 4 is formed by the bottom N-wefl 4A, first lateral N-well 4B and second N-well 4C.

Figure 3:
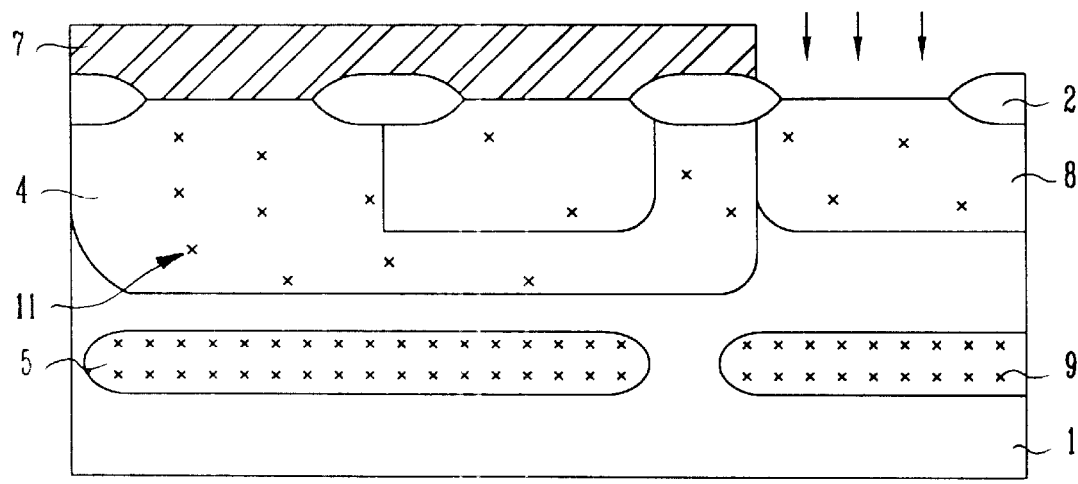

Referring to FIG. 3, the second pattern 6 is removed and a third pattern 7, which is a photoresist film, is formed on the semiconductor substrate 1. The third pattern 7 is formed so that the P-well forming area N is exposed. A second defect layer 9 is formed by implanting P-type high concentration impurity ion such as boron into the semiconductor substrate 1 using the third pattern 7 as a mask. Continuously, a P-well 8 is formed by implanting P-type impurity ion such as a boron into the semiconductor substrate 1 and then an ion implantation process for adjusting threshold voltage is performed using the third pattern 7 as a mask.

Figure 4:
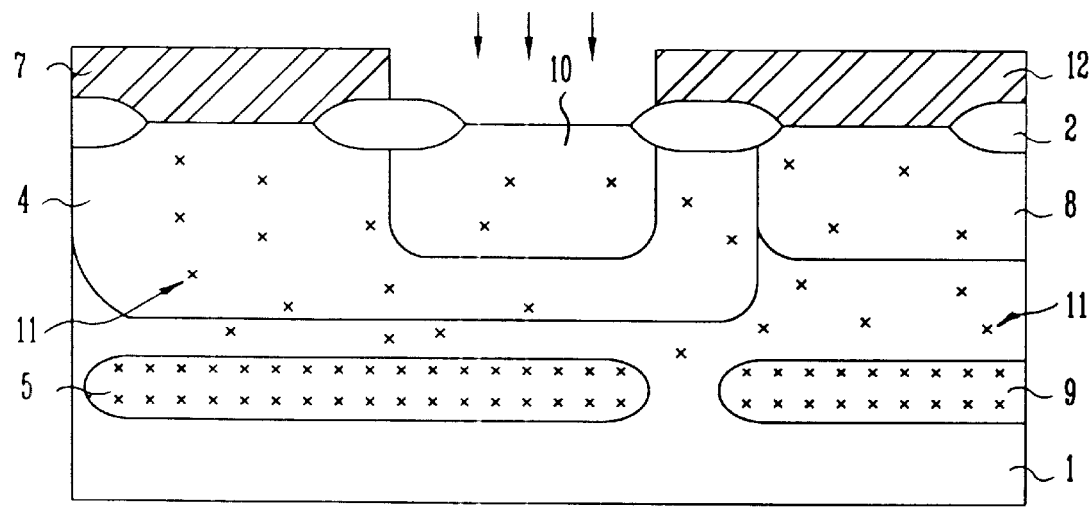

The second defect layer 9 is formed by implanting high concentration impurity ion such as boron, with energy of 1.5 to 2.5 MeV and dose of 1.0 E 14 to 3.0 E 15 ions/cm², into the substrate 1 using the third pattern as a mask. The second defect layer 9 is formed so that the highest ion concentration is obtained at the depth of 1.6 to 3.0 μm from the surface of the substrate 1. The second defect layer 9 is formed in the semiconductor substrate 1 at a third predetermined depth. The second defect layer 9 is separated at a predetermined distance from the P-well 8.;

cancel lines 17–21, and substitute—Referring to FIG. 4, the third pattern 7 is removed and a fourth pattern 12, which is a photoresist film, is formed on the semiconductor substrate 1. The fourth pattern 12 is formed so that the R-well forming area R is exposed. An R-well is described in UK published application 2320802 as being an inner P-well, P-wells being formed, e.g. with a P-type impurity ion such as boron. A R-well 10 is formed by implanting P-type impurity ion such as boron into the semiconductor substrate 1 and then an ion implantation process for adjusting threshold voltage is performed using the fourth patter 12 as a mask. The R-well 10 is formed in a portion of the semiconductor substrate 1 such that said R-well is enclosed at opposite ends thereof and at a bottom thereof by the N-well 4.

Referring to FIG. 4, the third pattern 7 is removed and a fourth photoresist film is then formed on the semiconductor substrate 1. The fourth photoresist film is patterned so that the RMOS transistor forming area R is exposed, thereby forming a fourth pattern 12. An ion implantation process for forming a R-well 10 and adjusting threshold voltage of the RMOS transistor is performed using the fourth pattern as a mask.

Figure 5:
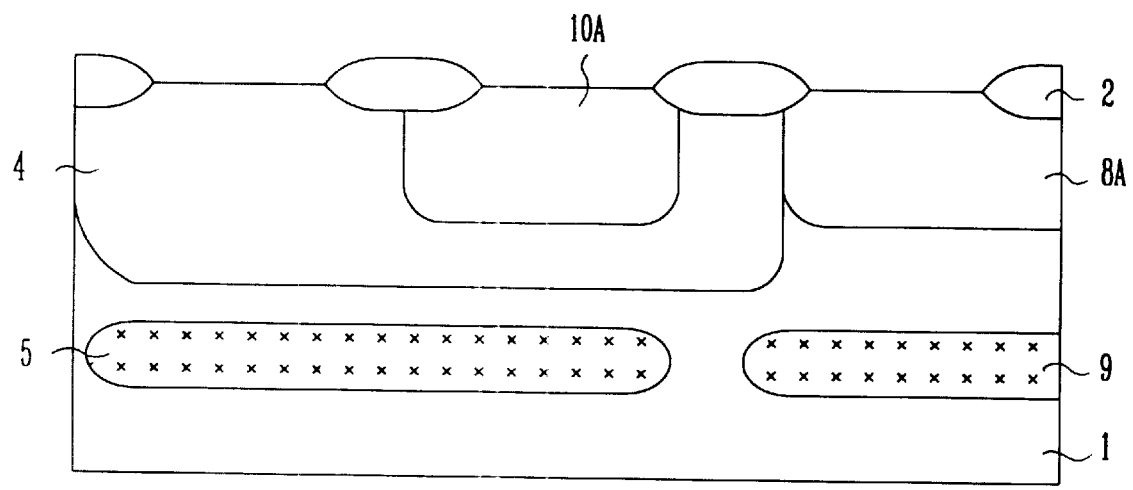

Referring to FIG. 5. rapid heat treatment form 10 to 40 minutes is performed at the temperature of 900 to 1150°, after removing the fourth pattern. The N-well 4, the P-well 8 and the R-well 10, which contain defects 11, change to a N-well 40, and a P-well 8A and a R-well 10A perfectly with no defects 11. At this time, the defects which exist in the semiconductor substrate 1 are captured by the first and the second defect layers 5 and 9 formed on the semiconductor substrate or diffuse outside through the surface by the rapid heat treatment. This process will be described in detail in the following.

As oxygen(O), carbon(C), other metallic defects, impurities and defects created by ion implantation, which exist in the semiconductor substrate 1, are at a very unstable state thermodynamically, they gather in the area of high defect density to return to the stable state at the time of the rapid heat treatment. Also, the primary defects which exist on surface of the semiconductor substrate 1 are eliminated by interacting with surrounding cavity or interstitial impurities, or a part of the defects diffuse outside through the surface of the semiconductor substrate.

As a result, the channel and junction areas not to contain defects and impurities, may be formed by the above process. Actual driving of transistors is performed in the depletion layer when bias voltage is applied to the surface of the semiconductor 1 and the drain area. Thus, as defects and impurities move to the defect layer and are captured, the dislocation or the stacking defects to cause leakage current in the junction area are removed and electric characteristics of a device improve.

As described above, the manufacturing method in accordance with the present invention has a shorter processing time than use of the conventional heat; treatment by 3 steps. Also the method in accordance with the present invention prevents characteristic change of dopants because long-time heat treatment is not applied. As additional retitle use is not needed, the process is simplified and transistor characteristics improved Also, as it is possible to get a device driving area with no defects and impurities if the present invention is used. Reliability and electric characteristics of a device may improve and latch-up that was a problem in manufacturing a non-memory device may improve as well. Also the process using expensive epitaxy layer longer requiring difficult process control may be replaced by the method of the present invention.

While the present invention has been described and illustrated herein with reference to the preferred embodiment thereof, it will be understood by those skilled in the art that various changes in form and details may be made therein without departing from the spirit and scope of the invention.

What is claimed is:

1. A method of manufacturing a semiconductor device having a triple-well structure, comprising the steps of:

forming a first pattern on a semiconductor substrate having a first N-well forming area, a R-well forming area, a second N-well forming area and a P-well forming area, and said first pattern is formed so that said first N-well forming area, said R-well forming area and said second N-well forming area are exposed;

forming a first defect layer within said substrate at a first depth from a surface of the substrate by implanting a first N-type impurity ion using said first pattern as a mask;

forming a bottom N-well within said substrate at a depth a second distance from said substrate surface by implanting a second N-type impurity ion using said first pattern as a mask, and said bottom N-well is formed over said first defect layer with said bottom N-well separated at a distance form said first layer;

removing said first pattern;

forming a second pattern on said substrate, and second pattern is formed so that said first N-well forming area and said second N-well forming area between said R-well forming area and said P-well forming area, are exposed;

forming a first lateral N-well and a second lateral N-well by implanting a third N-type impurity ion using said second pattern as a mask, with portions of said first and second lateral N-wells overlapping opposite end edge portions of said N-well, thereby forming a N-well;

removing said second pattern;

forming a third pattern on said substrate, and said third pattern is formed so that said P-well forming area is exposed;

forming a second defect layer within said substrate at a third depth below the substrate surface by implanting a first P-type impurity ion using said third pattern as a mask;

forming a P-well by implanting a second P-type impurity ion using the third pattern as a mask, and said P-well is formed over said second defect layer and said bottom N-well is separated at a distance from said second defect layer;

removing the third pattern;

forming a fourth pattern on said substrate, and said forth pattern in formed so that said R-well forming area is exposed;

forming a R-well by implanting a third P-type impurity ion using said fourth pattern as a mask, and said R-well is formed in a portion of said substrate which is enclosed by said N-well;

removing said fourth pattern; and performing rapid heat treatment.

2. The method of claim 1, wherein said first defect layer is formed at condition of the energy of 2.0 to 3.0 MeV and dose of 1.0E14 to 3.0E15 ions/cm$^2$ said bottom N-well is formed at condition of the energy of 1.5 to 1.7 MeV and dose 1.0E13 to 3.0E13 ions/cm$^2$.

3. A method of claim 1, wherein said second defect layer is formed at condition of the energy of 1.5 to 2.5 MeV and dose of 1.0E14 to 3.0E15 ions/cm$^2$.

4. The method of claims 1, wherein said rapid heat treatment is performed at the temperature of 900 to 1150° for 10 to 40 minutes.

* * * * *